(12) United States Patent
Stacey

(10) Patent No.: US 6,889,818 B2
(45) Date of Patent: May 10, 2005

(54) WAFER BLADE CONTACT MONITOR

(75) Inventor: David A. Stacey, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/409,859

(22) Filed: Apr. 9, 2003

(65) Prior Publication Data

US 2004/0201231 A1 Oct. 14, 2004

(51) Int. Cl.[7] .................. B65G 25/04; B65G 47/00; B65G 37/00; G05B 15/00; G05B 19/00
(52) U.S. Cl. .................. 198/750.11; 198/468.2; 198/468.5; 700/258; 414/222.07; 414/222.13
(58) Field of Search .................. 198/750.11, 468.2; 414/225.01, 222.07, 222.13, 560, 561, 744.5, 940; 700/245, 253, 254, 258

(56) References Cited

U.S. PATENT DOCUMENTS

| 5,510,993 | A | * | 4/1996 | Williams et al. ............ 700/248 |
| 6,454,327 | B1 | | 9/2002 | Chang ........................ 294/1.1 |
| 6,514,033 | B2 | | 2/2003 | Sundar ..................... 414/744.5 |
| 6,604,624 | B2 | * | 8/2003 | Hirata et al. ................ 198/494 |

* cited by examiner

*Primary Examiner*—Gene O. Crawford
(74) *Attorney, Agent, or Firm*—Westman, Champlin & Kelly

(57) ABSTRACT

A method and apparatus are provided for detecting contact between a wafer blade of a wafer-handling robot and a component in a wafer-handling system. The robot moves the wafer blade within the system while the wafer blade is maintained at an electrical potential, which is different from an electrical potential of the component. Contact between the wafer blade and the component is detected by sensing a change in the electrical potential of the wafer blade during the contact.

20 Claims, 4 Drawing Sheets

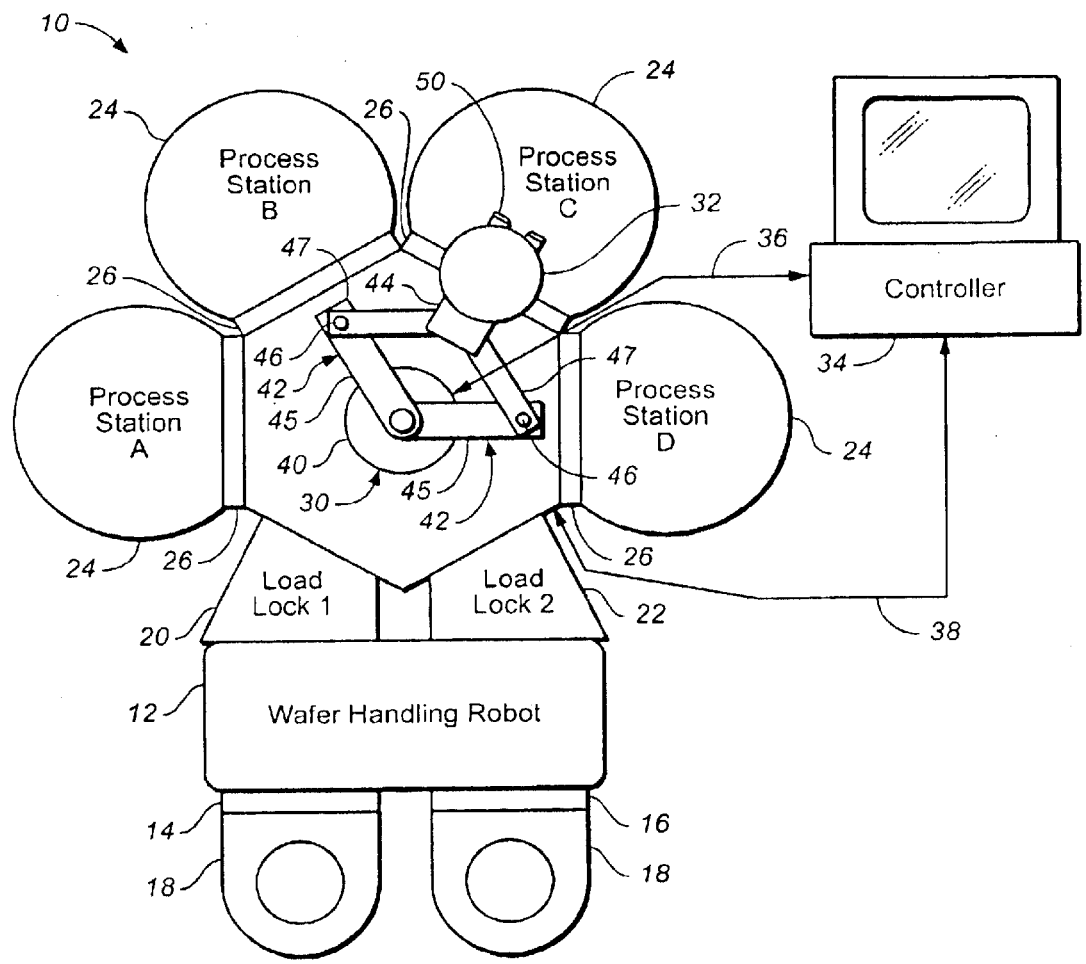
FIG._1

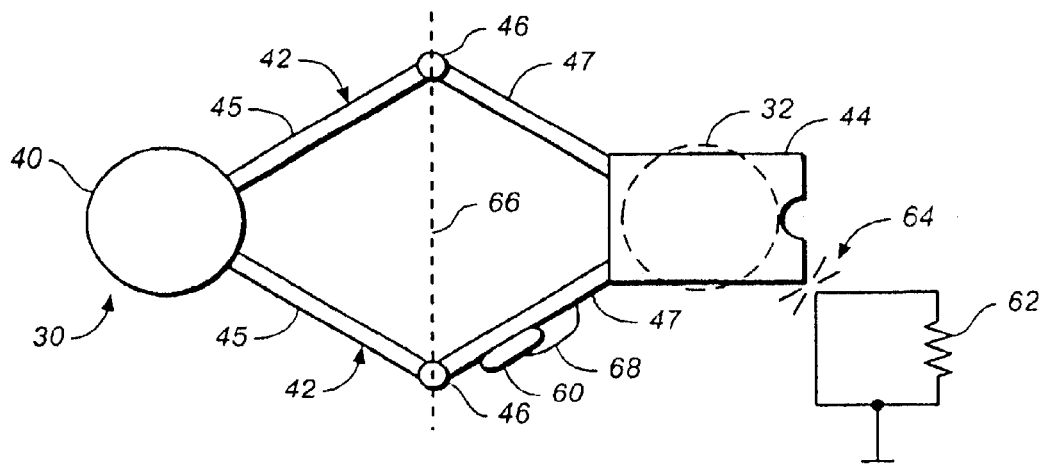
FIG._2
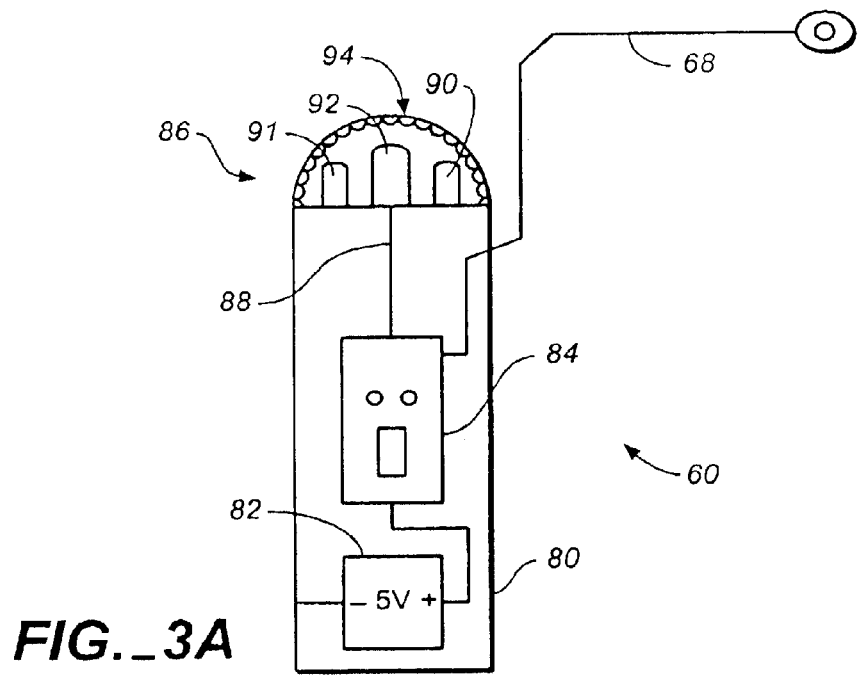
FIG._3A
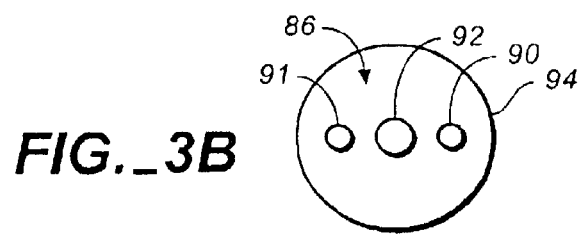
FIG._3B

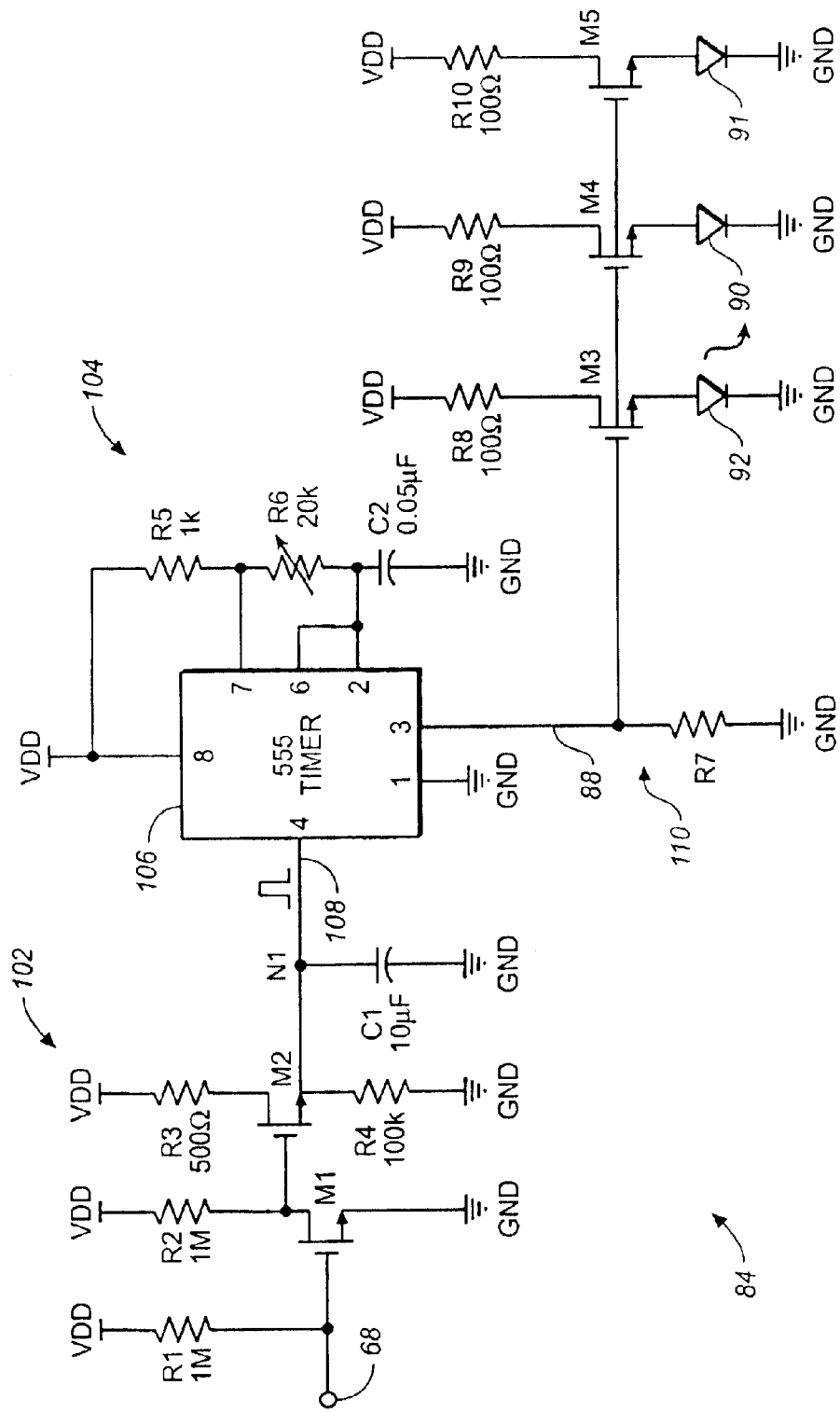
FIG._4

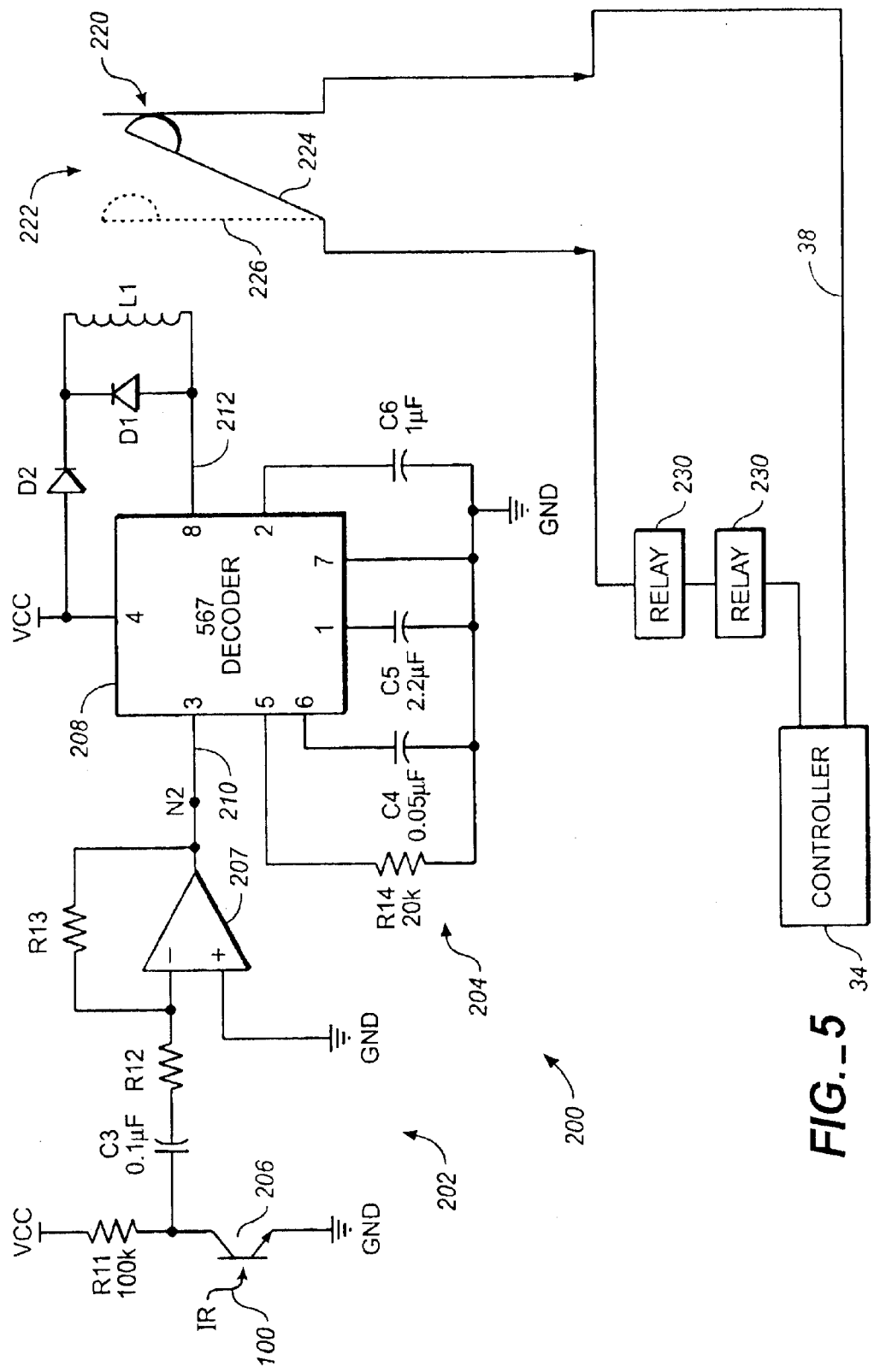
FIG._5

WAFER BLADE CONTACT MONITOR

FIELD OF THE INVENTION

The present invention relates to substrate-based wafer manufacturing and processing equipment and, more specifically to robotic devices for transporting wafers within such equipment.

BACKGROUND OF THE INVENTION

Semiconductor and other substrate-based wafers are typically fabricated or processed within multi-process "cluster tool" systems. A cluster tool is a manufacturing system that includes a set of environmentally isolated process chambers or modules, which are linked by a wafer-handling interface robot and a computer communications interface. The wafer-handling robot transports each wafer between the various modules in the system. The computer communication interface controls the sequential steps. There are several types of cluster tool systems, such as vacuum cluster tools for deposition and etching, lithography tools, chemical-mechanical polishing systems, ion implant tools and wafer inspection tools.

The wafer-handling robot has one or more articulated arms that support a wafer blade for carrying each wafer within the system. For example, a typical wafer-handling robot includes a pair of frog-leg type robotic arms that provide radial and rotational movement of the wafer blade in a fixed plane within the system. This movement is coordinated by the computer communications interface to pick up and drop off wafers and to transport the wafers between the various processing modules.

The wafer blade typically includes a relatively thin and planar piece of rigid material that supports the back surface of the wafer during transport. The wafer blade can also include an upwardly extending bridge at its distal end to assist in stabilizing the wafer.

Occasionally, slight alignment drift or shift of the wafer-handling robot or its arms can cause the wafer blade to contact the housing, the frame or another component in the system. This contact can release particles that can fall onto the wafer and cause defects. Since this type of contact is intermittent in nature, the contact can be nearly impossible to reproduce and can go undetected for a very long period of time. The intermittent nature of the contact often makes trouble shooting ineffective.

Currently, the only way to determine that there might be an alignment problem is to detect poor yields and high defect counts during a subsequent inspection step. In addition, the next inspection step may not occur until after several additional processing steps. This further adds to the difficulty in detecting and troubleshooting alignment problems. Therefore, the existing approach may not detect a problem until the damage is already done, or it may not detect the problem at all.

Improved methods and apparatus are desired for detecting or troubleshooting alignment errors in wafer-handling robots.

SUMMARY OF THE INVENTION

One embodiment of the present invention is directed to a method of detecting contact between a wafer blade of a wafer-handling robot and a component in a wafer-handling system. The method includes: (a) moving the wafer blade within the system with the robot; (b) maintaining the wafer blade at an electrical potential during movement of the wafer blade, wherein the electrical potential of the wafer blade is different from an electrical potential of the component; and (c) sensing a change in the electrical potential of the wafer blade during contact of the wafer blade with the component.

Another embodiment of the present invention is directed to a wafer-handling system. The wafer-handling system includes a component, a wafer-handling robot and a contact sensor. The robot includes a robotic arm, which supports a wafer blade for transporting a wafer in the system. The wafer blade has a different electrical potential than the component. The contact sensor is electrically coupled to the wafer blade to sense a change in the electrical potential of the wafer blade during contact between the wafer blade and the component.

Another embodiment of the present invention is directed to a wafer blade contact sensor for sensing contact between a wafer blade of a wafer-handling robot and a component in a wafer-handling system. The contact sensor includes a sense wire for electrically coupling to the wafer blade and a sensor circuit, which is electrically-coupled to the sense wire. The sensor circuit generates a contact output signal in response to a change in an electrical potential of the sense wire.

BRIEF DESCRIPTION OF THE DRAWINGS

FIG. 1 is a schematic illustration of a typical multi-process cluster tool system in which the present invention is useful.

FIG. 2 is a diagram, which schematically illustrates a contact sensor coupled to a robot in the system shown in FIG. 1, according to one embodiment of the present invention.

FIG. 3A is a diagram, which schematically illustrates the contact sensor in greater detail, according to one embodiment of the present invention.

FIG. 3B is a diagram, which schematically illustrates a top plan view of a clear plastic dome in the contact sensor shown in FIG. 3A, according to one embodiment of the present invention.

FIG. 4 is a schematic diagram illustrating a sensor circuit in the contact sensor, according to one embodiment of the present invention.

FIG. 5 is a schematic diagram illustrating a receiver that can be used for receiving a contact indicator signal transmitted by the contact sensor, according to one embodiment of the present invention.

DETAILED DESCRIPTION OF ILLUSTRATIVE EMBODIMENTS

FIG. 1 is a schematic illustration of a multi-process cluster tool system 10 in which the present invention is useful. However, the present invention can also be used in any other type of wafer-handling system in which a substrate wafer is transported or moved by a wafer-handling robot.

Cluster tool system 10 includes a wafer loading/unloading module 12 with load/unload ports 14 and 16. In FIG. 1, standard Front Opening Unified Pods (FOUPs) 18 are "docked" at load/unload ports 14 and 16. Pods 18 hold a plurality of wafers in horizontally oriented slots to be loaded into or unloaded out of cluster tool system 10. Wafer loading/unloading module 12 includes a wafer-handling robot for transporting individual wafers to and from ports 14 and 16 and load lock chambers 20 and 22.

Cluster tool system 10 further includes a plurality of substrate processing stations 24. Each processing station 24 has a processing chamber entrance 26 for providing access to the station. A further wafer-handling robot 30 interfaces with load lock chambers 20 and 22 and process stations 24 along a predefined substrate travel path. FIG. 1 shows robot 30 transporting a wafer 32 into one of the processing stations 24.

Robot 30 has a hub 40 and a pair of articulated arms 42 that support a wafer blade 44 for carrying wafer 32 within system 10. Each arm 42 has a proximal section 45, an elbow 46 and a distal, wrist section 47. Elbow joint 46 connects wrist section 47 to proximal section 45 and has a bearing for allowing relative movement. The distal end of wrist section 47 is attached to wafer blade 44.

In one embodiment, wafer blade 44 is formed of a relatively thin, rigid material and has a substantially planar top surface for carrying wafer 32. Wafer blade 44 can also include an upwardly extending bridge 50 at its distal end for preventing wafer 32 from slipping off the distal end.

Robot 30, arms 42 and wafer blade 44 can have a variety of different configurations in alternative embodiments of the present invention. For example, robot 30 can have a single arm 42, a pair of arms as shown in FIG. 1 or multiple pairs of arms for separately carrying multiple wafers at the same time. Also, each arm 42 can have any number of articulated sections. The configuration shown in FIG. 1 is provided as an example only.

During operation of cluster tool system 10, occasional, slight alignment drift or shift can cause the bottom or edges of wafer blade 44 or wafer 32 to contact the frame, housing or another component within system 10. Contact by wafer blade 44 or wafer 32 can release particles that can fall onto the wafer and cause defects.

This type of contact is often intermittent in nature making it nearly impossible to reproduce and allowing the problem to go undetected for a very long period of time. In one embodiment of the present invention, this contact is detected by sensing a change in the electrical potential of wafer blade 44 (or current though the blade) during the contact. In many wafer-handling systems, the frame, housing and other components in the system are electrically grounded, whereas the wafer blades have a floating electrical potential due to electrical isolation by one or more of the elements in the robotic arm or bearings. Contact with a grounded component within system 10 can therefore cause a change in the electrical potential of wafer blade 44 if the wafer blade is electrically conductive. In one embodiment, wafer blade 44 is constructed of titanium. However, any other electrically conductive material can be used. Alternatively, wafer blade 44 can be formed of an electrically non-conductive material, with electrically conductive material being positioned at typical contact points along the blade.

Controller 34 controls cluster tool system 10, including robot 30 through control signals 36. Controller 34 can also monitor the electrical potential of wafer blade 44 or a signal from a separate contact monitor, which indicates when contact occurs. Control signals 36 can include one or more drive signals for controlling movement of robot 30 and the operation of various other elements in system 10, and can include associated power signals for providing power to the elements of system 10. In one embodiment, controller 34 cuts power to robot 30 when unwanted contact is detected so the area of contact can be more easily and immediately determined.

For example, controller 34 can include one or more interlocked loops 38. Each interlocked loop 38 is a series electrical circuit having one or more normally closed relays, which are operated by one or more sensors within the system. For example, these sensors can detect whether an access panel or hood in system 10 is open or whether one of the processing stations 24 has an operating error. If such an error condition is detected, the sensor opens the respective relay contacts, which brakes interlock loop 38. In one embodiment of the present invention, interlock loop 38 includes an additional relay contact that is controlled by a contact sensor, as described in more detail below. If contact is detected, the contact sensor opens the relay contacts to break interlock loop 38.

Controller 34 detects the open-circuit condition on interlock loop 38 and modifies the control signals 36 accordingly. For example, controller 34 can stop movement or operation of any of the elements in system 10, such as robot 30, or cut-off power to any of the elements.

FIG. 2 is a diagram, which schematically illustrates a contact sensor 60 coupled to robot 30 according to one embodiment of the present invention. Contact sensor 60 senses a change in the electrical potential wafer blade 44 during contact (shown by arrow 64) with a component 62 in system 10 (shown in FIG. 1) Contact sensor 60 has a sense wire 68, which is electrically attached to distal, wrist section 47 or to wafer blade 44.

As with many of the other components in system 10, component 62 is electrically grounded through an electrical connection to ground terminal GND. Wafer blade 44 has a floating electrical potential. Although robot 30 is typically grounded, certain elements along arms 42 can be electrically isolating. For example, the bearings in elbow joints 46 can provide an electrical isolation between proximal section 45 and distal, wrist section 47, which is represented by dashed line 66. Therefore, distal, wrist section 47 also has a floating electrical potential. If wrist section 47 is electrically conductive and coupled to wafer blade 44, sense line 68 can be attached to wrist section 47 rather than having to be attached directly to wafer blade 44 where space may be limited.

The brief contact 64 with component 62 causes the electrical potential of wafer blade 44 and wrist sections 47 to briefly drop toward the potential of ground terminal GND. This also causes a brief and slight current flow from contact sensor 60 toward ground terminal GND, through wrist section 48, wafer blade 44 and component 62. Contact sensor 60 detects this potential or current change and generates an output signal indicative of the contact. In one embodiment, contact sensor 60 is attached to arm 42. However, contact sensor 60 can be positioned anywhere on robot 30 or anywhere internal or external to the system.

FIGS. 3A and 3B are diagrams that schematically illustrate contact sensor 60 in greater detail according to one embodiment of the present invention. Contact sensor 60 includes a housing 80, an internal battery 82, sensor circuitry 84, contact indicators 86 and sense line 68. Battery 82 provides electrical power to sensor circuitry 84 and contact indicators 86. Sensor circuitry 84 monitors the electrical potential on or current flow through sense line 68 and generates a contact output signal 88 when a change is detected. Output signal 88 drives contact indicators 86.

Contact indicators 86 can include any indicator that is capable of being visually perceived by a human operator or received by a receiver positioned elsewhere in the system. In one embodiment, contact indicators 86 include two visible light emitting diodes (LEDs) 90 and 91 and one infrared light emitting diode 92, which are positioned within a clear plastic dome 94 in housing 80. Visible LEDs 90 and 91 allow a human operator to observe cluster tool system 10

(shown in FIG. 1) during operation and detect when and where contact may occur. Infrared LED 92 can be used to transmit the contact output signal from contact sensor 60 to a receiver positioned elsewhere within system 10 (shown in FIG. 1) or external to the system. In one embodiment, infrared LED 92 is modulated to transmit the contact output signal.

Other types of contact indicators can be used, such as an audible indicator. Also, the contact output signal can be transmitted by any other wireless method, such as a radio frequency (RF) signal, or by a direct wire.

FIG. 4 is a schematic diagram illustrating sensor circuitry 84 according to one embodiment of the present invention. In this embodiment, electrical circuitry 84 forms a transmitter for transmitting an infrared signal 100 to a remote receiver (shown in FIG. 2) and for driving visible LEDs 90 and 91. The component values shown in FIG. 4 are provided as examples only. Any suitable values can be used.

Sensor circuit 84 has an input circuit 102 for sensing the change in electrical potential on sense line 68 and generating a corresponding pulse on node N1. Input circuit 102 includes N-channel transistors M1 and M2, bias resistors R1–R4 and capacitor C1. Sense wire 68 forms a sensor input, which is coupled to the gate of N-channel transistor M1. Transistor M1 has a source coupled to ground terminal GND and a drain coupled to bias resistor R2 and the gate of transistor M2. Bias resistor R1 is coupled between the gate of transistor M1 and voltage supply terminal VDD. Bias resistor R2 is coupled between the drain of transistor M1 and voltage supply terminal VDD. Bias resistor R3 is coupled between the drain of transistor M2 and voltage supply terminal VDD. The source of transistor M2 is coupled to node N1. Bias resistor R4 and capacitor C1 are coupled between node N1 and voltage supply terminal VDD.

When sense wire 68 has a floating electrical potential (during normal operation), bias resistor R1 pulls the gate of transistor M1 high, which turns M1 on. Transistor M1 therefore pulls the gate of transistor M2 low, turning off transistor M2. With transistor M2 off, resistor R4 pulls node N1 low.

When wafer blade 44 (shown in FIGS. 1 and 2) contacts an electrically grounded component within the system, the electrical potential on sense wire 68 briefly goes low, turning off transistor M1. Bias resistor R2 briefly pulls the gate of transistor M2 high causing transistor M2 to turn on briefly and charge node N1. A pulse is therefore formed on node N1 during contact. Since the contact causes a relatively noisy signal to be generated on sense wire 68, capacitor C1 filters the noise to generate a more defined pulse on node N1.

The pulse on node N1 is supplied to modulator 104. Modulator 104 is configured to generate a modulated set (or burst) of pulses on output 88 for each pulse received on node N1. In the embodiment shown in FIG. 4, modulator 104 includes a "555" type Integrated Circuit Timer 106, which is commercially available from a variety of sources. For example, timer 106 can include the LMC555 CMOS Timer from National Semiconductor Corporation. Other types of timer circuits can also be used.

The standardized pin numbers of the "555" type timer circuit 106 are provided in FIG. 4. Node N1 is coupled to reset input 108 (pin 4) of timer 106. Resistors R5 and R6 and capacitor C2 set the duration, frequency and number of pulses generated on output 88 for each pulse received on reset input 108. In one embodiment, timer circuit 106 generates a one-second burst of pulses on output 88. However, any other time duration can also be used.

Output 88 is coupled to LED driver circuit 110. LED driver circuit 110 includes bias resistors R7–R10, N-channel transistors M3–M5 and LEDs 90–92. Output 88 is coupled to the gates of transistors M3–M5. Bias resistor R7 is coupled between output 88 and ground terminal GND. Bias resistors R8–R10 are coupled between the drains of transistors M3–M5, respectively, and voltage supply terminal VDD. LEDs 92, 90 and 91 are coupled between the sources of transistor M3–M5, respectively, and voltage supply terminal GND.

When modulator 104 generates a burst of pulses on output 88, each pulse briefly turns on transistors M3–M5, thereby pulsing LEDs 90–92 on and off with each pulse on output 88. Visible LEDs 90 and 91 therefore generate a visible indication that contact has occurred, whereas LED 92 generates a one-time modulated IR burst 100 that can be detected by a remote receiver. The modulation frequency of the IR signal burst can be set such that the signal does not interfere with other IR transmitters and receivers in the system.

The transmitter circuit shown in FIG. 4 is provided as an example only. Any type of transmitter or circuit can be used for generating a signal indicative of contact by the wafer blade in alternative embodiments of the present invention.

FIG. 5 is a schematic diagram illustrating a receiver 200 that can be used for receiving the IR signal 100 according to one embodiment of the present invention. Again, the component values shown in FIG. 5 are provided as examples only. Any suitable values can be used. Receiver 200 includes input circuit 202 and decoder circuit 204. Input circuit 202 includes IR receiving transistor 206, resistors R11–R13, capacitor C3 and inverting amplifier 207. IR receiving transistor 206 is coupled in series with resistor R11, between power and ground supply terminals VCC and GND, for generating a modulated voltage on the inverting input of inverting amplifier 207 in response to IR signal 100. Capacitor C3 and resistor R2 filter the modulated signal. Inverting amplifier 207 amplifies the modulated signal to provide a strong set of pulses on node N2, which can be decoded by decoder circuit 204.

In the embodiment shown in FIG. 5, decoder circuit 204 includes a "567" type tone decoder circuit 208, which is commercially available from a variety of sources such as National Semiconductor Corporation. Again, the standardized pin numbers for the "567" type tone decoder are provided in FIG. 5. Node N2 is coupled to signal input 210 (pin 3) of tone decoder 208. Timing resistor R14, time capacitor C4, output filter capacitor C5 and loop filter capacitor C6 are coupled to tone decoder 208 are coupled to the tone decoder and have values that are selected to set the center frequency, bandwidth and output delay of the tone decoder. When the appropriate modulated signal is received on signal input 210, tone decoder 208 generates a logic low signal on output 212. Otherwise, output 212 is normally high.

The low signal on output 88 indicates contact by the wafer blade and can be used in any manner to detect and respond to the contact. In the embodiment shown in FIG. 5, output 212 is coupled to a relay 220, which is coupled within one of the interlock loops 38 of the cluster tool system. Interlock loop 38 can further include additional relays, such as relays 230 that are controlled by other components in the system. Relay 220 has a diode D1 and an inductor L1, which are coupled between output 212 and diode D2. Diode D2 is coupled to voltage supply terminal VCC. Relay 220 has a pair of contacts 222, which have a normally closed state 224.

When tone decoder 208 generates a low signal pulse on output 212, current flows through inductor L1 and generates a magnetic field that momentarily pulls contacts 222 into an open state 226 (shown in dashed lines). This breaks interlock loop 38 causing the robot to stop moving the wafer blade immediately after contact is detected. This allows the problem to be pinpointed in the system and corrected before any further wafers are contaminated. With the wafer blade stopped, the operator of the system can observe the position of the wafer blade at the instant contact occurs so that troubleshooting can be performed more easily.

In this manner, the contact sensor can monitor the wafer blade for contact while production is running. This reduces troubleshooting time to near zero, and can result in avoidance of yield loss due to particle defects or other damage.

Also, the wafers themselves can occasionally contact components within the system. However, wafer substrates are typically formed of an electrically non-conductive material. Contact by the wafer itself can be easily tested in this system by placing an electrically conductive wafer on the wafer blade and monitoring the contact sensor's output. The electrically conductive wafer would conduct current from the contact point to the wafer blade during contact. Other applications can also be used. For example, the contact sensor can be configured as a portable monitor that can be placed on the robot while adjustments are made and then removed, with the LEDs or other indicators announcing contact.

Although the present invention has been described with reference to preferred embodiments, workers skilled in the art will recognize that changes may be made in form and detail without departing from the spirit and scope of the invention. The term "coupled" used in the specification and the claims can include a direct connection or a connection through one or more additional components.

What is claimed is:

1. A method of detecting contact between a wafer blade of a wafer-handling robot and a component in a wafer-handling system, the method comprising:
    (a) moving the wafer blade within the system with the robot;
    (b) maintaining the wafer blade at an electrical potential during movement of the wafer blade, wherein the electrical potential of the wafer blade is different from an electrical potential of the component; and
    (c) sensing a change in the electrical potential of the wafer blade during contact of the wafer blade with the component.

2. The method of claim 1 and further comprising:
    (d) placing an electrically-conductive wafer on the wafer blade such that the wafer is electrically coupled to the wafer blade;
    (e) carrying the wafer on the wafer blade during step (a); and
    (f) sensing a change in an electrical potential of the wafer during contact of the wafer with a component in the system by sensing a change in the electrical potential of the wafer blade.

3. The method of claim 1 wherein step (b) comprises maintaining the wafer blade at a floating electrical potential during movement of the wafer blade.

4. The method of claim 3 wherein the electrical potential of the component is a ground potential, and step (c) comprises sensing a change in the electrical potential of the wafer blade toward the ground potential.

5. The method of claim 1 wherein the robot comprises an arm having at least one section that is electrically coupled to the wafer blade and wherein step (c) comprises sensing the change in the electrical potential of the wafer blade through a change in an electrical potential of the section of the arm during contact of the wafer blade with the component.

6. The method of claim 5 and further comprising:
    (d) providing a contact sensor for sensing the change in electrical potential in step (c) through a sense wire; and
    (e) mounting the contact sensor on the arm and electrically coupling the sense wire to the section of the arm.

7. The method of claim 1 and further comprising:
    (d) generating a contact indicator signal in response to the change in electrical potential sensed in step (c).

8. The method of claim 7 wherein the contact indicator signal is visually-perceptible.

9. The method of claim 7 and further comprising:
    (e) transmitting the contact indicator signal as a wireless signal to a receiver.

10. The method of claim 7 and further comprising:
    (e) stopping movement of the wafer blade in step (a) in response to the contact indicator signal.

11. The method of claim 10 wherein the robot comprises an interlock loop, which controls operation of the robot and wherein step (e) comprises breaking the interlock loop in response to the contact indicator signal.

12. A wafer-handling system comprising:
    a component having an electrical potential;
    a wafer-handling robot having a robotic arm, which supports a wafer blade for transporting a wafer in the system, wherein the wafer blade has a different electrical potential than the component; and
    a sensor electrically coupled to the wafer blade to sense a change in the electrical potential of the wafer blade during contact between the wafer blade and the component.

13. The wafer-handling system of claim 12 wherein the component has a ground electrical potential and the wafer blade has a floating electrical potential during movement of the wafer blade in the system.

14. The wafer-handling system of claim 12 wherein:
    the robotic arm comprises at least one section that is electrically coupled to the wafer blade; and
    the sensor is electrically coupled to the section of the robotic arm to sense the change in the electrical potential of the wafer blade through a change in an electrical potential of the section of the arm during contact of the wafer blade with the component.

15. The wafer-handling system of claim 12 wherein the sensor generates a contact output signal in response to the change in the electrical potential and comprises a contact indicator, which is perceptible by a human operator and is driven by the contact output signal.

16. The wafer-handling system of claim 12 wherein the sensor comprises:
    a transmitter, which is mounted to the robot and has a sense wire electrically coupled to the wafer blade to sense the change in the electrical potential of the wafer blade, wherein the transmitter transmits a contact indicator signal in response to the change in the electrical potential; and
    a receiver, which is remote from the transmitter and receives the contact indicator signal.

17. The wafer-handling system of claim 16 wherein the robot comprises an interlock loop, which controls operation of the robot and the receiver is coupled to break the interlock loop when the receiver receives the contact indicator signal.

18. A wafer blade contact sensor for sensing contact between a wafer blade of a wafer-handling robot and a component in a wafer-handling system, the contact sensor comprising:

a sense wire for electrically coupling to the wafer blade; and a sensor circuit, which is electrically-coupled to the sense wire and generates a contact output signal in response to a change in an electrical potential of the wafer blade, as sensed by the sense wire, due to electrical contact between the wafer blade and the component.

19. The wafer blade contact sensor of claim 18 and further comprising:

a contact indicator, which is perceptible by a human operator and is driven by the contact output signal.

20. The wafer blade contact sensor of claim 18 wherein the sensor circuit comprises a transmitter, which transmits a wireless contact signal in response to the contact output signal, and wherein the sensor further comprises a receiver, which is remote from the transmitter and receives the wireless contact signal.

\* \* \* \* \*